(12) United States Patent
Lee

(10) Patent No.: US 10,483,309 B1
(45) Date of Patent: Nov. 19, 2019

(54) IMAGE SENSORS WITH MULTIPART DIFFRACTIVE LENSES

(71) Applicant: SEMICONDUCTOR COMPONENTS INDUSTRIES, LLC, Phoenix, AZ (US)

(72) Inventor: Byounghee Lee, Meridian, ID (US)

(73) Assignee: SEMIDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

(21) Appl. No.: 16/125,479

(22) Filed: Sep. 7, 2018

(51) Int. Cl.
*H01L 27/146* (2006.01)

(52) U.S. Cl.
CPC .............. *H01L 27/14627* (2013.01)

(58) Field of Classification Search
CPC ............................................. H01L 27/14625; H01L 27/146–14645; G02B 5/1885; G02B 3/0056
See application file for complete search history.

(56) References Cited

U.S. PATENT DOCUMENTS

| | | | |
|---|---|---|---|
| 4,878,735 A | 11/1989 | Vilums | |
| 5,734,155 A | 3/1998 | Rostoker | |
| 9,099,580 B2 | 8/2015 | Hirigoyen et al. | |
| 2005/0110104 A1 | 5/2005 | Boettiger et al. | |
| 2005/0242271 A1 | 11/2005 | Weng et al. | |
| 2006/0093793 A1* | 5/2006 | Miyakawa | B29D 11/0073 428/172 |
| 2006/0145056 A1 | 7/2006 | Jung | |
| 2006/0177959 A1 | 8/2006 | Boettiger | |
| 2006/0292735 A1 | 12/2006 | Boettiger et al. | |
| 2007/0001252 A1 | 1/2007 | Noda et al. | |
| 2007/0127125 A1 | 6/2007 | Sasaki | |
| 2007/0278604 A1 | 12/2007 | Minixhofer | |
| 2009/0090937 A1 | 4/2009 | Park | |
| 2009/0127440 A1 | 5/2009 | Nakai | |
| 2009/0160965 A1 | 6/2009 | Sorek et al. | |
| 2010/0091168 A1 | 4/2010 | Igarashi | |
| 2011/0096210 A1 | 4/2011 | Koshino et al. | |
| 2011/0234830 A1 | 9/2011 | Kiyota et al. | |
| 2013/0015545 A1 | 1/2013 | Toumiya et al. | |
| 2013/0038691 A1 | 2/2013 | Agranov et al. | |
| 2013/0240962 A1 | 9/2013 | Wang et al. | |
| 2014/0091205 A1 | 4/2014 | Takamiya | |

(Continued)

OTHER PUBLICATIONS

Lee, U.S. Appl. No. 15/719,174, filed Sep. 28, 2017.

(Continued)

*Primary Examiner* — Sonya D. McCall-Shepard
(74) *Attorney, Agent, or Firm* — Treyz Law Group, P.C.; Joseph F. Guihan

(57) ABSTRACT

An image sensor may include an array of imaging pixels. Each imaging pixel may have a photosensitive area that is covered by a respective multipart diffractive lens to focus light onto the photosensitive area. The multipart diffractive lenses may have multiple portions with different indices of refraction. The portions of the diffractive lenses closer to the center of the diffractive lenses may have higher indices of refraction to focus light. Alternatively, the portions of the diffractive lenses closer to the center of the diffractive lenses may have lower indices of refraction to defocus light. The multipart diffractive lenses may have stacked layers with the same refractive indices but different widths.

13 Claims, 11 Drawing Sheets

(56) References Cited

U.S. PATENT DOCUMENTS

| | | |
|---|---|---|
| 2014/0197301 A1 | 7/2014 | Velichko et al. |
| 2014/0313379 A1 | 10/2014 | Mackey |
| 2015/0109501 A1 | 4/2015 | Sekine |
| 2016/0111461 A1 | 4/2016 | Ahn et al. |
| 2016/0211306 A1 | 7/2016 | Choi et al. |
| 2016/0269662 A1 | 9/2016 | Hepper et al. |
| 2016/0351610 A1 | 12/2016 | Chen |
| 2016/0377871 A1 | 12/2016 | Kress et al. |
| 2017/0077163 A1 | 3/2017 | Chou et al. |
| 2017/0133420 A1 | 5/2017 | Silsby |
| 2017/0141145 A1 | 5/2017 | Yamashita et al. |
| 2017/0176787 A1 | 6/2017 | Jia et al. |
| 2018/0026065 A1 | 1/2018 | Hsieh et al. |
| 2018/0145103 A1 | 5/2018 | Hirigoyen |

OTHER PUBLICATIONS

Lee, U.S. Appl. No. 15/719,181, filed Sep. 28, 2017.
Lenchenkov et al., U.S. Appl. No. 15/701,116, filed Sep. 11, 2017.

\* cited by examiner

IMAGE SENSORS WITH MULTIPART DIFFRACTIVE LENSES

BACKGROUND

This relates generally to image sensors and, more particularly, to image sensors having lenses to focus light.

Image sensors are commonly used in electronic devices such as cellular telephones, cameras, and computers to capture images. In a typical arrangement, an electronic device is provided with an array of image pixels arranged in pixel rows and pixel columns. Each image pixel in the array includes a photodiode that is coupled to a floating diffusion region via a transfer gate. Each pixel receives incident photons (light) and converts the photons into electrical signals. Column circuitry is coupled to each pixel column for reading out pixel signals from the image pixels. Image sensors are sometimes designed to provide images to electronic devices using a Joint Photographic Experts Group (JPEG) format.

Conventional image sensors sometimes include a color filter element and a microlens above each pixel. The microlenses of conventional image sensors typically have curved surfaces and use refraction to focus light on an underlying photodiode. However, these types of microlenses may allow peripheral light to pass through the microlenses without being focused, leading to optical cross-talk.

It would therefore be desirable to provide improved lenses for image sensors.

DETAILED DESCRIPTION

Figure 1:
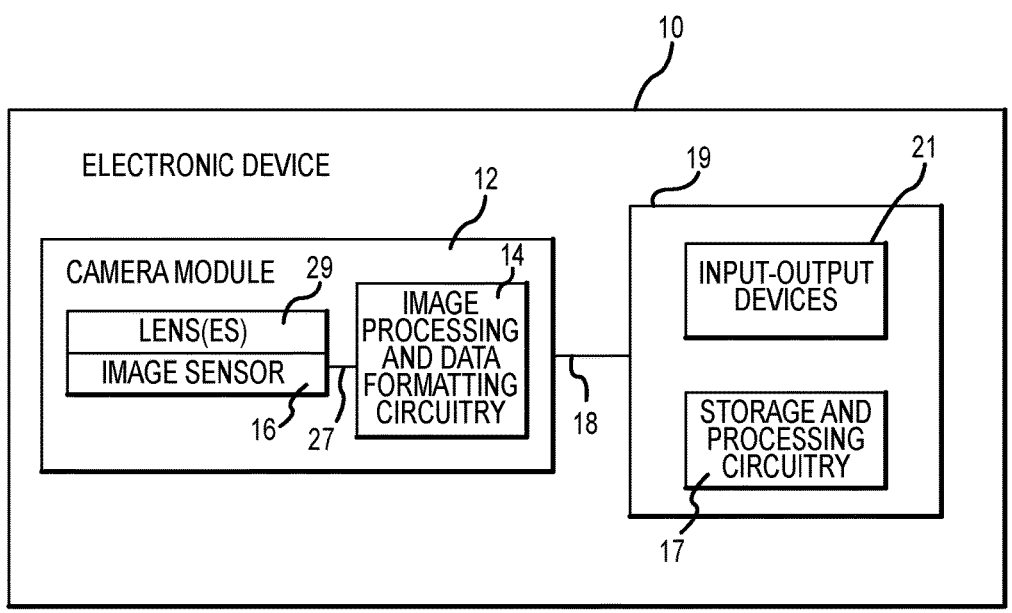
FIG. 1 is a schematic diagram of an illustrative electronic device that may include an image sensor in accordance with an embodiment.

Embodiments of the present invention relate to image sensors with pixels that include diffractive lenses. An electronic device with a digital camera module is shown in FIG. 1. Electronic device 10 may be a digital camera, a computer, a cellular telephone, a medical device, or other electronic device. Camera module 12 (sometimes referred to as an imaging device) may include image sensor 16 and one or more lenses 29. During operation, lenses 29 (sometimes referred to as optics 29) focus light onto image sensor 16. Image sensor 16 includes photosensitive elements (e.g., pixels) that convert the light into digital data. Image sensors may have any number of pixels (e.g., hundreds, thousands, millions, or more). A typical image sensor may, for example, have millions of pixels (e.g., megapixels). As examples, image sensor 16 may include bias circuitry (e.g., source follower load circuits), sample and hold circuitry, correlated double sampling (CDS) circuitry, amplifier circuitry, analog-to-digital (ADC) converter circuitry, data output circuitry, memory (e.g., buffer circuitry), address circuitry, etc.

Still and video image data from image sensor 16 may be provided to image processing and data formatting circuitry 14 via path 27. Image processing and data formatting circuitry 14 may be used to perform image processing functions such as automatic focusing functions, depth sensing, data formatting, adjusting white balance and exposure, implementing video image stabilization, face detection, etc. For example, during automatic focusing operations, image processing and data formatting circuitry 14 may process data gathered by phase detection pixels in image sensor 16 to determine the magnitude and direction of lens movement (e.g., movement of lens 29) needed to bring an object of interest into focus.

Image processing and data formatting circuitry 14 may also be used to compress raw camera image files if desired (e.g., to Joint Photographic Experts Group or JPEG format). In a typical arrangement, which is sometimes referred to as a system on chip (SOC) arrangement, camera sensor 16 and image processing and data formatting circuitry 14 are implemented on a common integrated circuit. The use of a single integrated circuit to implement camera sensor 16 and image processing and data formatting circuitry 14 can help to reduce costs. This is, however, merely illustrative. If desired, camera sensor 14 and image processing and data formatting circuitry 14 may be implemented using separate integrated circuits. If desired, camera sensor 16 and image processing circuitry 14 may be formed on separate semiconductor substrates. For example, camera sensor 16 and image processing circuitry 14 may be formed on separate substrates that have been stacked.

Camera module 12 may convey acquired image data to host subsystems 19 over path 18 (e.g., image processing and data formatting circuitry 14 may convey image data to subsystems 19). Electronic device 10 typically provides a user with numerous high-level functions. In a computer or advanced cellular telephone, for example, a user may be provided with the ability to run user applications. To implement these functions, host subsystem 19 of electronic device 10 may include storage and processing circuitry 17 and input-output devices 21 such as keypads, input-output ports, joysticks, and displays. Storage and processing circuitry 17 may include volatile and nonvolatile memory (e.g., random-access memory, flash memory, hard drives, solid state drives, etc.). Storage and processing circuitry 17 may also include microprocessors, microcontrollers, digital signal processors, application specific integrated circuits, or other processing circuits.

Figure 2:
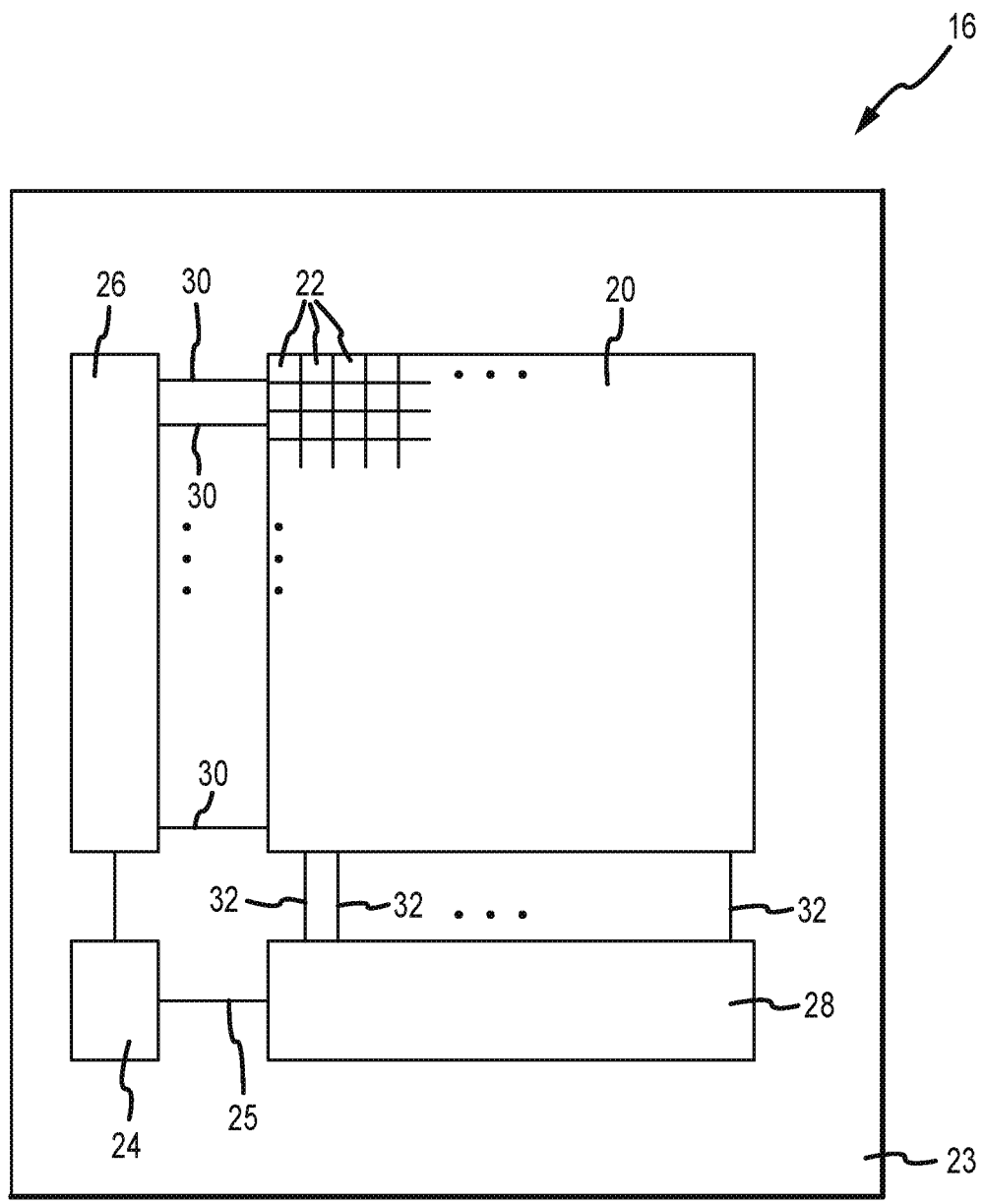
FIG. 2 is a diagram of an illustrative pixel array and associated readout circuitry for reading out image signals from the pixel array in accordance with an embodiment.

As shown in FIG. 2, image sensor 16 may include pixel array 20 containing image sensor pixels 22 arranged in rows and columns (sometimes referred to herein as image pixels or pixels) and control and processing circuitry 24 (which may include, for example, image signal processing circuitry). Array 20 may contain, for example, hundreds or thousands of rows and columns of image sensor pixels 22. Control circuitry 24 may be coupled to row control circuitry 26 and image readout circuitry 28 (sometimes referred to as column control circuitry, readout circuitry, processing circuitry, or column decoder circuitry). Pixel array 20, control and processing circuitry 24, row control circuitry 26, and image readout circuitry 28 may be formed on a substrate 23. If desired, some or all of the components of image sensor 16 may instead be formed on substrates other than substrate 23, which may be connected to substrate 23, for instance, through wire bonding or flip-chip bonding.

Row control circuitry 26 may receive row addresses from control circuitry 24 and supply corresponding row control signals such as reset, row-select, charge transfer, dual conversion gain, and readout control signals to pixels 22 over row control paths 30. One or more conductive lines such as column lines 32 may be coupled to each column of pixels 22 in array 20. Column lines 32 may be used for reading out image signals from pixels 22 and for supplying bias signals (e.g., bias currents or bias voltages) to pixels 22. If desired, during pixel readout operations, a pixel row in array 20 may be selected using row control circuitry 26 and image signals generated by image pixels 22 in that pixel row can be read out along column lines 32.

Image readout circuitry 28 may receive image signals (e.g., analog pixel values generated by pixels 22) over column lines 32. Image readout circuitry 28 may include sample-and-hold circuitry for sampling and temporarily storing image signals read out from array 20, amplifier circuitry, analog-to-digital conversion (ADC) circuitry, bias circuitry, column memory, latch circuitry for selectively enabling or disabling the column circuitry, or other circuitry that is coupled to one or more columns of pixels in array 20 for operating pixels 22 and for reading out image signals from pixels 22. ADC circuitry in readout circuitry 28 may convert analog pixel values received from array 20 into corresponding digital pixel values (sometimes referred to as digital image data or digital pixel data). Image readout circuitry 28 may supply digital pixel data to control and processing circuitry 24 over path 25 for pixels in one or more pixel columns.

Figure 3A:
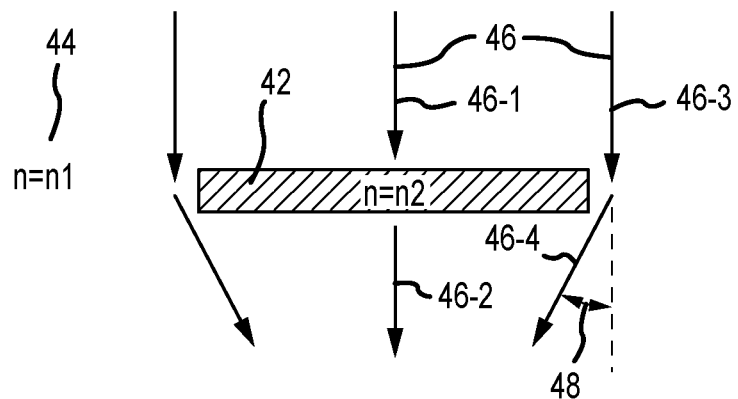
FIG. 3A is a cross-sectional side view of an illustrative focusing diffractive lens with a greater index of refraction than the surrounding medium in accordance with an embodiment.
Figure 3B:
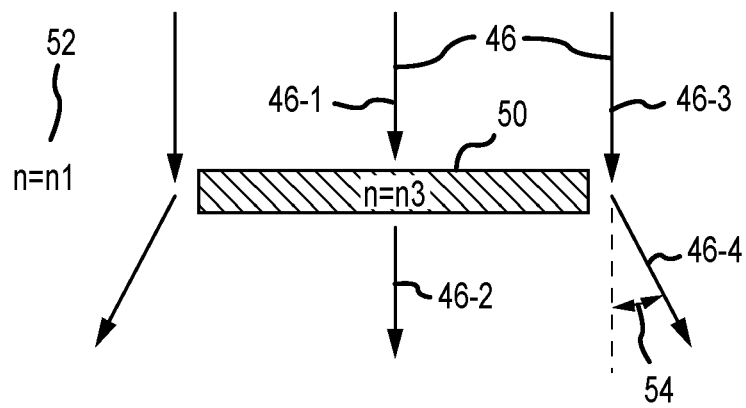
FIG. 3B is a cross-sectional side view of an illustrative defocusing diffractive lens with a lower index of refraction than the surrounding medium in accordance with an embodiment.

FIGS. 3A and 3B are cross-sectional side views of illustrative diffractive lenses that may be used in image sensors. As shown in FIG. 3A, a diffractive lens 42 may be formed in a surrounding medium 44. The surrounding material 44 may be formed from a first material that has a first index of refraction (n1). Diffractive lens 42 may be formed from a second material that has a second index of refraction (n2). In the example of FIG. 3A, the index of refraction of the lens may be greater than the index of refraction of the surrounding material (i.e., n2>n1). This results in incident light being focused towards a focal point. In this arrangement, diffractive lens 42 acts as a convex lens.

Lens 42 may be transparent to incident light. Therefore, some light may pass through the lens without being focused. For example, incident light 46-1 may pass through the center of diffractive lens 42. The corresponding light 46-2 on the other side of the diffractive lens may travel in the same direction as incident light 46-1. In contrast, incident light at the edge of diffractive lens 42 may be redirected due to diffraction. For example, incident light 46-3 may pass by the edge of diffractive lens 42. The light may be redirected such that the output light 46-4 travels at an angle 48 relative to the incident light 46-3. In other words, the diffractive lens redirects the light at the edge of the lens using diffraction.

Diffraction occurs when a wave (such as light) encounters an obstacle. When light passes around the edge of an object, it will be bent or redirected such that the direction of the original incident light changes. The amount and direction of bending depends on numerous factors. In an imaging sensor, diffraction of light can be used (with diffractive lenses) to redirect incident light in desired ways (i.e., focusing incident light on photodiodes to mitigate optical cross-talk).

In the example of FIG. 3A, diffractive lens 42 has an index of refraction greater than the index of refraction of the surrounding medium 44. This causes incident light to be focused towards a focal point. However, this example is merely illustrative and other embodiments may be used.

As shown in FIG. 3B, a diffractive lens 50 may be formed in a surrounding medium 52. The surrounding material 52 may be formed from a first material that has a first index of refraction (n1). Diffractive lens 50 may be formed from a third material that has a third index of refraction (n3). In the example of FIG. 3B, the index of refraction of the lens may be less than the index of refraction of the surrounding material (i.e., n1>n3). This results in incident light 46 being defocused. In this arrangement, diffractive lens 50 acts as a concave lens.

Lens 50 may be transparent to incident light. Therefore, some light may pass through the lens without being focused. For example, incident light 46-1 may pass through the center of diffractive lens 50. The corresponding light 46-2 on the other side of the diffractive lens may travel in the same direction as incident light 46-1. In contrast, incident light at the edge of diffractive lens 50 may be redirected due to diffraction. For example, incident light 46-3 may pass by the edge of diffractive lens 50. The light may be redirected such that the output light 46-4 travels at an angle 54 relative to the incident light 46-3. In other words, the diffractive lens redirects the light at the edge of the lens using diffraction.

Figure 4A:
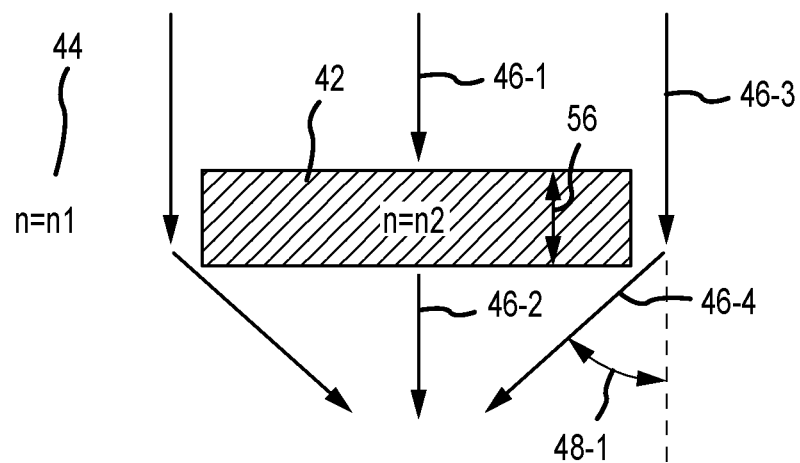
FIGS. 4A and 4B are cross-sectional side views of illustrative diffractive lenses showing how the thickness of the diffractive lens may be adjusted to change the response to incident light in accordance with an embodiment.
Figure 4B:
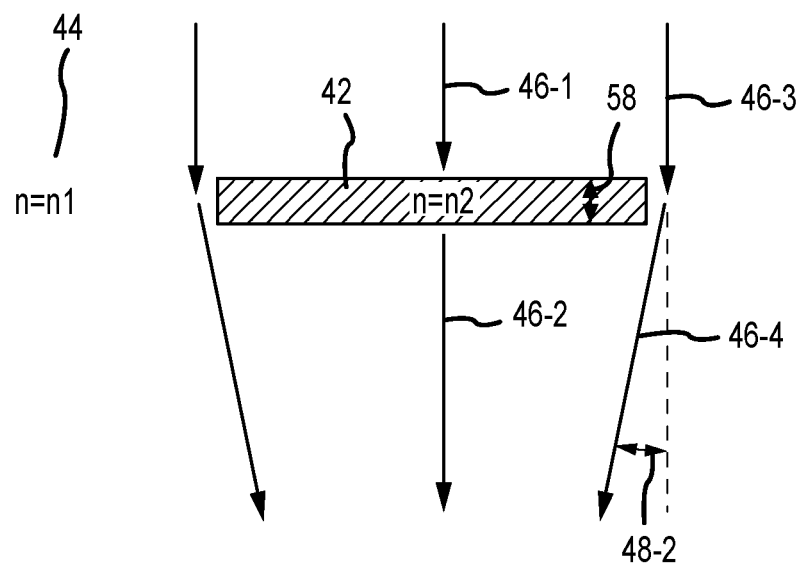

In addition to the refractive indices of the diffractive lens and the surrounding material, the thickness of the diffractive lens may also affect the response of incident light to the diffractive lens. FIGS. 4A and 4B show illustrative diffractive lenses used to focus incident light (as in FIG. 3A, for example). As shown in FIG. 4A, a diffractive lens 42 may be formed in a surrounding medium 44. The surrounding material 44 may be formed from a first material that has a first index of refraction (n1). Diffractive lens 42 may be formed from a second material that has a second index of refraction (n2). In the example of FIG. 4A, the index of refraction of the lens may be greater than the index of refraction of the surrounding material (i.e., n2>n1). This results in the light being focused to a focal point.

In particular, incident light 46-3 may pass by the edge of diffractive lens 42. The light may be redirected such that the output light 46-4 travels at an angle 48-1 relative to the incident light 46-3. This angle may be dependent upon the thickness 56 of diffractive lens 42. In the example of FIG. 4A, thickness 56 is associated with an angle of diffraction of 48-1. Diffractive lens 42 in FIG. 4A may have a relatively large thickness and, accordingly, a relatively large angle of diffraction 48-1.

In contrast, diffractive lens 42 in FIG. 4B may have a relatively small thickness and a relatively small angle of diffraction 48-2. As shown in FIG. 4B, a diffractive lens 42 may be formed in a surrounding medium 44. The surrounding material 44 may be formed from a first material that has a first index of refraction (n1). Diffractive lens 42 may be formed from a second material that has a second index of refraction (n2). In the example of FIG. 4B, the index of refraction of the lens may be greater than the index of refraction of the surrounding material (i.e., n2>n1). This results in the light being focused to a focal point. In particular, the light at the edge of the diffractive lens may be redirected such that the output light 46-4 travels at an angle 48-2 relative to the incident light 46-3. This angle may be dependent upon the thickness 58 of diffractive lens 42. Because thickness 58 in FIG. 4B is less than thickness 56 in FIG. 4A, angle 48-2 in FIG. 4B is less than angle 48-1 in FIG. 4A.

Diffractive lenses 42 in FIGS. 4A and 4B have the same length and width. However, the length and width of diffractive lenses may also be adjusted to alter the response of incident light 46. The diffractive lenses may only redirect incident light that passes within a given distance of the edge of the diffractive lens (e.g., the interface between the two materials having different indices of refraction). The given distance may be approximately one half of the wavelength of the incident light.

This shows how diffractive lenses may be used to redirect incident light in desired ways. The refractive indices of the lens and surrounding material may be altered to customize the response of incident light. Additionally, the thickness, length, and width, of the diffractive lens may be altered to customize the response of incident light.

In FIGS. 3A, 3B, 4A, and 4B, diffractive lenses (e.g., diffractive lens 42 and diffractive lens 50) are depicted as being formed from a single layer of material having a first index of refraction that is surrounded by a surrounding medium having a second index of refraction that is different than the first index of refraction. Because these diffractive lenses have one uniform index of refraction (and therefore one refractive index difference between the lens and surrounding medium), these types of diffractive lenses may be referred to as single-edge diffractive lenses. These types of diffractive lenses may also be referred to as single-refractive-index diffractive lenses.

The aforementioned single-edge diffractive lenses may be effective at focusing or defocusing light at the edges of the diffractive lens. Light at the center of the diffractive lenses may pass through without being focused or defocused as desired. However, light between the center and edges of the diffractive lenses passes through the diffractive lens without being focused or defocused. This may not be desirable, as performance of the lens may be improved if light between the center and edges of the diffractive lens was also focused or defocused.

To better focus light, a diffractive lens may therefore have two or more portions with different refractive indices. Examples of this type are shown in FIGS. 5A and 5B.

Figure 5A:
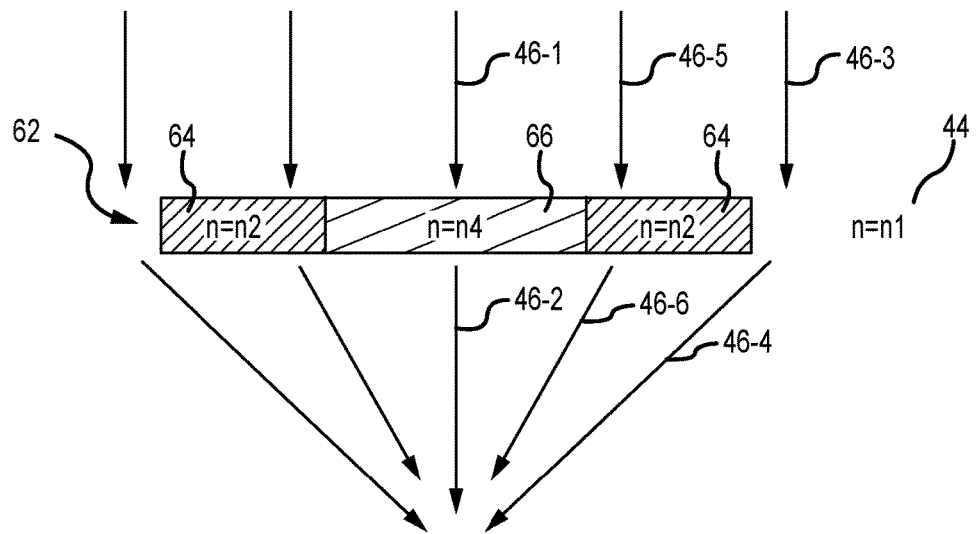
FIG. 5A is a cross-sectional side view of an illustrative multipart focusing diffractive lens with two portions having greater indices of refraction than the surrounding medium in accordance with an embodiment.
Figure 5B:
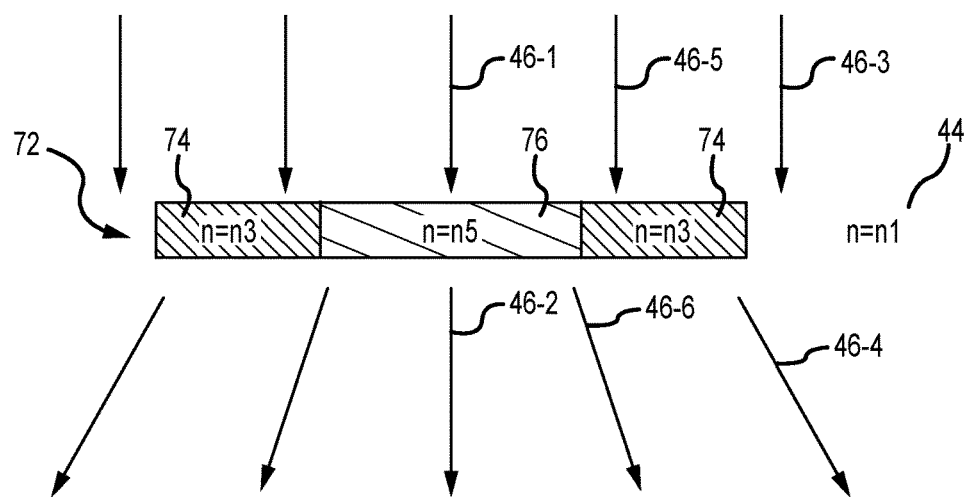
FIG. 5B is a cross-sectional side view of an illustrative multipart defocusing diffractive lens with two portions having lower indices of refraction than the surrounding medium in accordance with an embodiment.

As shown in FIG. 5A, a diffractive lens 62 may be formed in a surrounding medium 44. The surrounding material 44 may be formed from a first material that has a first index of refraction (n1). Diffractive lens 62 may have first portions 64 formed from a second material that has a second index of refraction (n2) and a second portion 66 formed from a third material that has a third index of refraction (n4). In the example of FIG. 5A, the index of refraction of the second portion of the lens (n4) may be greater than the index of refraction of the first portion of the lens (n2) and the index of refraction of the first portion of the lens may be greater than the index of refraction of the surrounding material (i.e., n4>n2>n1). This results in incident light being focused towards a focal point. In this arrangement, diffractive lens 62 acts as a convex lens.

Lens 62 (i.e., both portions 64 and 66 of lens 62) may be transparent to incident light. Therefore, some light may pass through the lens without being focused. For example, incident light 46-1 may pass through the center of portion 66 of diffractive lens 62. The corresponding light 46-2 on the other side of the diffractive lens may travel in the same direction as incident light 46-1. In contrast, incident light at the edge of diffractive lens 62 may be redirected due to diffraction. For example, incident light 46-3 may pass by the edge of diffractive lens 62. The light may be redirected such that the output light 46-4 travels at an angle relative to the incident light 46-3. In other words, the diffractive lens redirects the light at the edge of the lens using diffraction. Additionally, due to the additional refractive index difference between portions 64 and 66 of the diffractive lens, light between the edge and center of the diffractive lens may also be redirected. For example, incident light 46-5 may pass by the interface of portions 64 and 66 of diffractive lens 62. The light may be redirected such that the output light 46-6 travels at an angle relative to the incident light 46-5.

The difference in refractive index between each material may be any desired refractive index difference (e.g., greater than 0.2, greater than 0.3, greater than 0.4, greater than 0.5, greater than 0.8, greater than 1.0, between 0.2 and 0.5, between 0.2 and 0.8, between 0.2 and 1.0, less than 1.0, less than 0.5, less than 0.3, etc.).

The example of the diffractive lens having two portions in FIG. 5A is merely illustrative. If desired, the diffractive lens may have three portions having different refractive indices (as will be shown in FIG. 5C), four portions having different refractive indices, five portions having different refractive indices, more than five portions having different refractive indices, etc. Regardless of how many portions are present in the diffractive lens, each pair of adjacent portions may have a corresponding refractive index difference. For example, the refractive index of each portion may increase proportionally with the distance of the portion from the edge (meaning that an edge portion such as portion 64 has a lower refractive index than a center portion such as portion 66). Said another way, the refractive index of each portion may decrease proportionally with the distance of the portion from the center.

In the example of FIG. 5A, diffractive lens 62 causes incident light to be focused towards a focal point. However, this example is merely illustrative and other embodiments may be used. FIG. 5B shows a diffractive lens with two or more portions having different refractive indices that defocuses light.

As shown in FIG. 5B, a diffractive lens 72 may be formed in a surrounding medium 44. The surrounding material 44 may be formed from a first material that has a first index of refraction (n1). Diffractive lens 72 may have first portions 74 formed from a second material that has a second index of refraction (n3) and a second portion 76 formed from a third material that has a third index of refraction (n5). In the example of FIG. 5B, the index of refraction of the second portion of the lens (n5) may be less than the index of refraction of the first portion of the lens (n3) and the index of refraction of the first portion of the lens (n3) may be less than the index of refraction of the surrounding material (i.e., n5<n3<n1). This results in incident light being defocused. In this arrangement, diffractive lens 72 acts as a concave lens.

Lens 72 (i.e., both portions 74 and 76 of lens 72) may be transparent to incident light. Therefore, some light may pass through the lens without being focused. For example, incident light 46-1 may pass through the center of portion 76 of diffractive lens 72. The corresponding light 46-2 on the other side of the diffractive lens may travel in the same direction as incident light 46-1. In contrast, incident light at the edge of diffractive lens 72 may be redirected due to diffraction. For example, incident light 46-3 may pass by the edge of diffractive lens 72. The light may be redirected such that the output light 46-4 travels at an angle relative to the incident light 46-3. In other words, the diffractive lens redirects the light at the edge of the lens using diffraction. Additionally, due to the additional refractive index difference between portions 74 and 76 of the diffractive lens, light between the edge and center of the diffractive lens may also be redirected. For example, incident light 46-5 may pass by the interface of portions 74 and 76 of diffractive lens 72. The light may be redirected such that the output light 46-6 travels at an angle relative to the incident light 46-5.

The difference in refractive index between each material may be any desired refractive index difference (e.g., greater than 0.2, greater than 0.3, greater than 0.4, greater than 0.5, greater than 0.8, greater than 1.0, between 0.2 and 0.5, between 0.2 and 0.8, between 0.2 and 1.0, less than 1.0, less than 0.5, less than 0.3, etc.). The example of the diffractive lens having two portions in FIG. 5B is merely illustrative. If desired, the diffractive lens may have three portions having different refractive indices, four portions having different refractive indices, five portions having different refractive indices, more than five portions having different refractive indices, etc. Each pair of adjacent portions may have a corresponding refractive index difference. For example, the refractive index of each portion may decrease proportionally with the distance of the portion from the edge (meaning that an edge portion such as portion 64 has a higher refractive index than a center portion such as portion 66). Said another way, the refractive index of each portion may increase proportionally with the distance of the portion from the center.

Figure 5C:
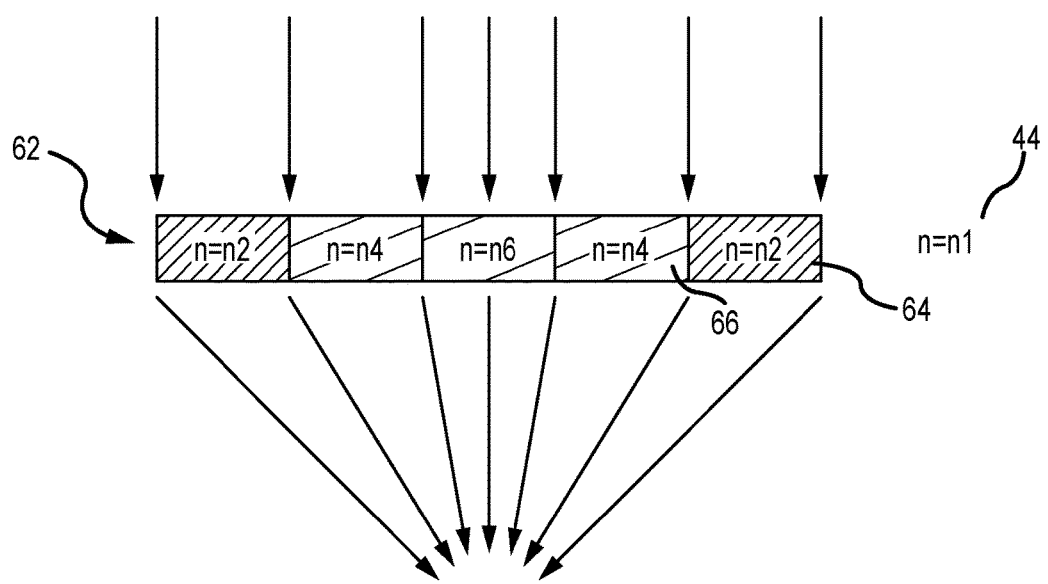
FIG. 5C is a cross-sectional side view of an illustrative multipart focusing diffractive lens with three portions having greater indices of refraction than the surrounding medium in accordance with an embodiment.
Figure 5D:
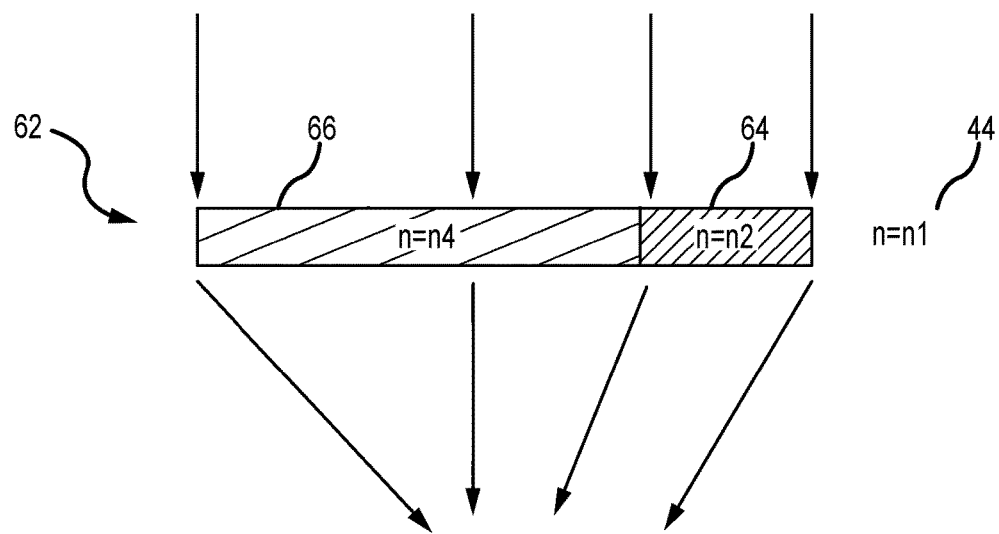
FIG. 5D is a cross-sectional side view of an illustrative asymmetric multipart focusing diffractive lens with two portions having greater indices of refraction than the surrounding medium in accordance with an embodiment.
Figure 5E:
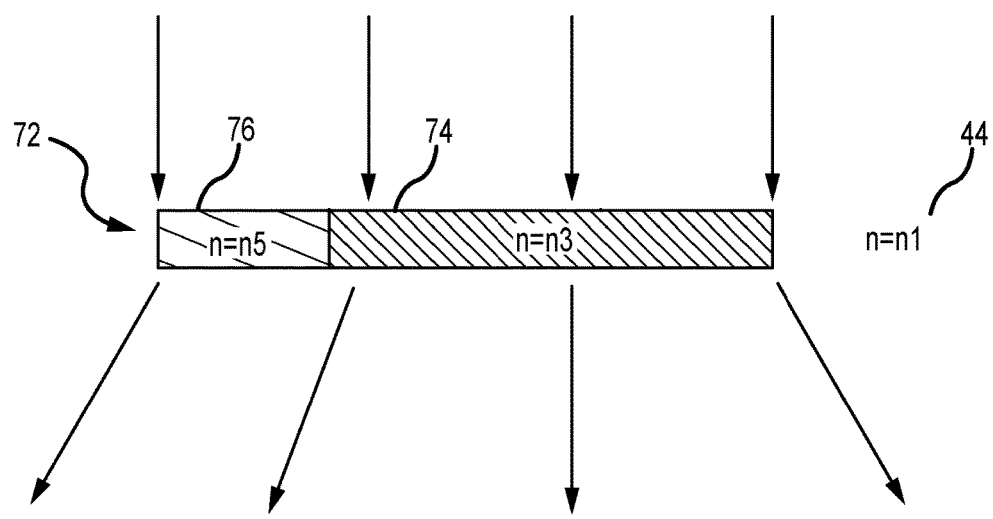
FIG. 5E is a cross-sectional side view of an illustrative asymmetric multipart defocusing diffractive lens with two portions having lower indices of refraction than the surrounding medium in accordance with an embodiment.

FIG. 5C is a cross-sectional side view of an illustrative diffractive lens with more than two portions. As shown in FIG. 5C, a focusing diffractive lens 62 may be formed in a surrounding medium 44. The surrounding material 44 may be formed from a first material that has a first index of refraction (n1). Diffractive lens 62 may have first portions 64 formed from a second material that has a second index of refraction (n2), a second portion 66 formed from a third material that has a third index of refraction (n4), and a third portion 68 formed from a fourth material that has a fourth index of refraction (n6). In the example of FIG. 5C, the index of refraction of the third portion of the lens (n6) may be greater than the index of refraction of the second portion of the lens (n4), the index of refraction of the second portion of the lens (n4) may be greater than the index of refraction of the first portion of the lens (n2), and the index of refraction of the first portion of the lens may be greater than the index of refraction of the surrounding material (i.e., n6>n4>n2>n1). This results in incident light being focused towards a focal point. In this arrangement, diffractive lens 62 acts as a convex lens. The portions of the diffractive lens in FIG. 5C may be concentric (i.e., all of the portions share a common geometrical center). In the examples of FIGS. 5A-5C, symmetrical diffractive lenses with two or more portions are shown. However, the diffractive lenses do not need to be symmetrical. The diffractive lens may instead be asymmetric to control the focusing/defocusing of the light in any desired manner. The diffractive lenses may be asymmetrical as shown in FIGS. 5D and 5E. As shown in FIG. 5D, a diffractive lens 62 may be formed in a surrounding medium 44. The surrounding material 44 may be formed from a first material that has a first index of refraction (n1). Diffractive lens 62 may have a first portion 64 formed from a second material that has a second index of refraction (n2) and a second portion 66 formed from a third material that has a third index of refraction (n4). In the example of FIG. 5A, the index of refraction of the second portion of the lens (n4) may be greater than the index of refraction of the first portion of the lens (n2) and the index of refraction of the first portion of the lens may be greater than the index of refraction of the surrounding material (i.e., n4>n2>n1). This results in incident light being focused towards a focal point. In this arrangement, diffractive lens 62 acts as a convex lens. Because the diffractive lens is asymmetric, the focal point may not be centered underneath the diffractive lens.

The difference in refractive index between each material may be any desired refractive index difference (e.g., greater than 0.2, greater than 0.3, greater than 0.4, greater than 0.5, greater than 0.8, greater than 1.0, between 0.2 and 0.5, between 0.2 and 0.8, between 0.2 and 1.0, less than 1.0, less than 0.5, less than 0.3, etc.). The example of the diffractive lens having two portions in FIG. 5D is merely illustrative. If desired, the asymmetric diffractive lens may have three portions having different refractive indices, four portions having different refractive indices, five portions having different refractive indices, more than five portions having different refractive indices, etc. Regardless of how many portions are present in the diffractive lens, each pair of adjacent portions may have a corresponding refractive index difference.

The asymmetric diffractive lens may instead be a defocusing diffractive lens. As shown in FIG. 5E, a diffractive lens 72 may be formed in a surrounding medium 44. The surrounding material 44 may be formed from a first material that has a first index of refraction (n1). Diffractive lens 72 may have a first portion 74 formed from a second material that has a second index of refraction (n3) and a second portion 76 formed from a third material that has a third index of refraction (n5). In the example of FIG. 5E, the index of refraction of the second portion of the lens (n5) may be less than the index of refraction of the first portion of the lens (n3) and the index of refraction of the first portion of the lens (n3) may be less than the index of refraction of the surrounding material (i.e., n5<n3<n1). This results in incident light being defocused. However, the defocusing is asymmetric due to the asymmetric structure of diffractive lens 72. In this arrangement, diffractive lens 72 acts as a concave lens.

The difference in refractive index between each material may be any desired refractive index difference (e.g., greater than 0.2, greater than 0.3, greater than 0.4, greater than 0.5, greater than 0.8, greater than 1.0, between 0.2 and 0.5, between 0.2 and 0.8, between 0.2 and 1.0, less than 1.0, less than 0.5, less than 0.3, etc.).

The example of the diffractive lens having two portions in FIG. 5E is merely illustrative. If desired, the asymmetric defocusing diffractive lens may have three portions having different refractive indices, four portions having different refractive indices, five portions having different refractive indices, more than five portions having different refractive indices, etc. Regardless of how many portions are present in the diffractive lens, each pair of adjacent portions may have a corresponding refractive index difference.

The diffractive lenses of FIGS. 5A-5E each have two or more portions with different refractive indices. The diffractive lenses may therefore be referred to as multiple-refractive-index diffractive lenses. The diffractive lenses of FIGS. 5A-5E also form multiple refractive index differences. For example, in FIG. 5A, the interface between portions 64 and surrounding material 44 is a first refractive index difference and the interface between portions 64 and portion 66 is a second refractive index difference. In FIG. 5B, the interface between portions 74 and surrounding material 44 is a first refractive index difference and the interface between portions 74 and portion 76 is a second refractive index difference. The lenses of FIG. 5A-5E may therefore sometimes be referred to as multiple-edge diffractive lenses, multiple-portioned diffractive lenses, compound diffractive lenses, composite diffractive lenses, multipart diffractive lenses, etc.

Figure 6:
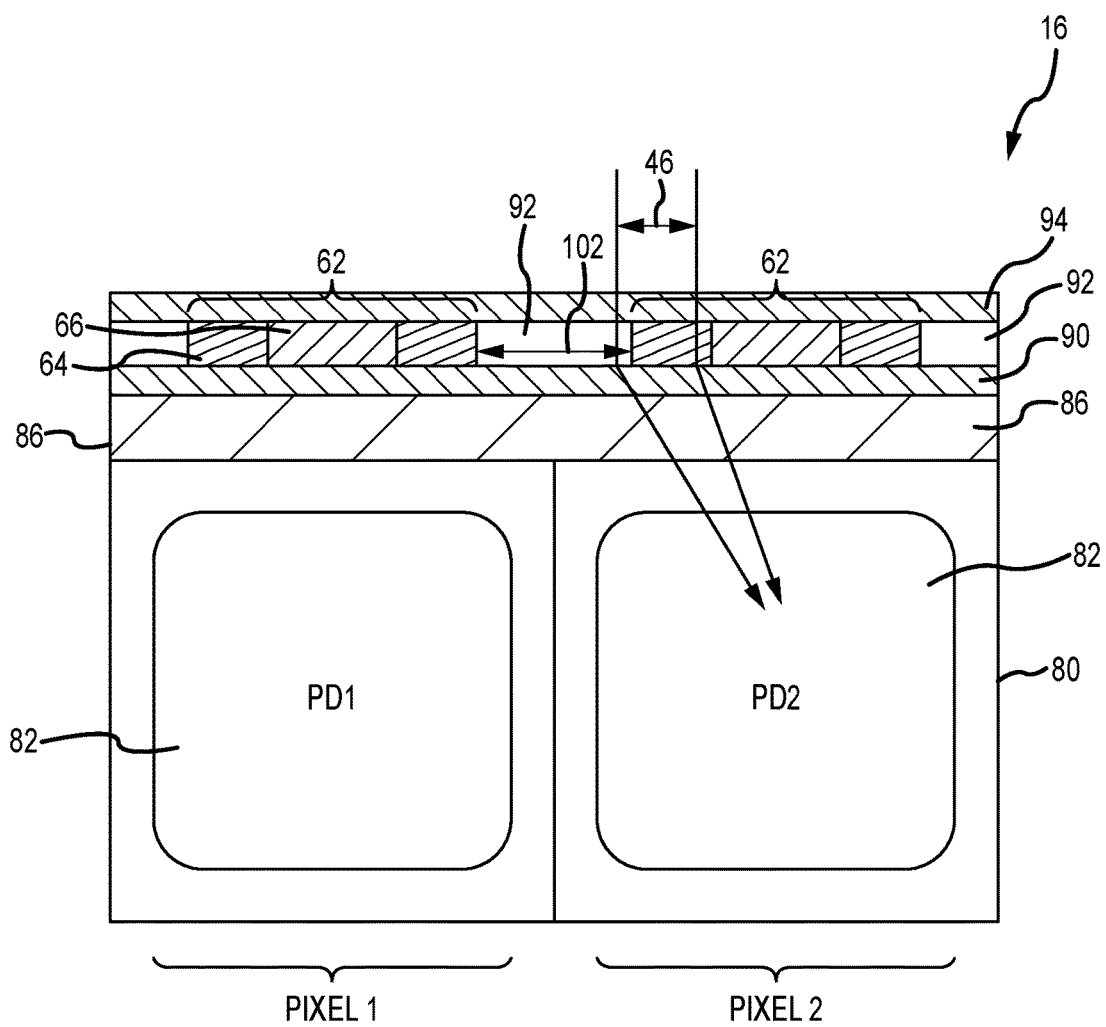
FIG. 6 is a cross-sectional side view of an illustrative image sensor with multipart diffractive lenses formed over the photosensitive area of each pixel in accordance with an embodiment.

FIG. 6 is a cross-sectional side view of an illustrative image sensor with diffractive lenses. Image sensor 16 may include first and second pixels such as Pixel 1 and Pixel 2. Pixel 1 and Pixel 2 may include photosensitive regions 82 formed in a substrate such as silicon substrate 80. For example, Pixel 1 may include an associated photosensitive region such as photodiode PD1, and Pixel 2 may include an associated photosensitive region such as photodiode PD2. Isolation regions may optionally be included between and/or around PD1 and PD2. The isolation regions may include a metal or metal/dielectric grid, deep trench isolation or doped portions of substrate 80. Diffractive lenses 62 may be formed over photodiodes PD1 and PD2 and may be used to direct incident light towards photodiodes PD1 and PD2.

As discussed in connection with FIG. 5A, diffractive lenses 62 may be formed from two or more portions having different refractive indices (e.g., portions 64 and 66). An additional anti-reflective coating (sometimes referred to as a diffractive lens anti-reflective coating) may be formed on one or more surfaces of diffractive lenses 62 if desired.

Color filters such as color filter elements 86 may be interposed between diffractive lenses 62 and substrate 80. Color filter elements 86 may filter incident light by only allowing predetermined wavelengths to pass through color filter elements 86 (e.g., color filter 86 may only be transparent to the certain ranges of wavelengths). Color filter elements 86 may be part of a color filter array formed on the back surface of substrate 80. A respective diffractive lens 62 may cover each color filter element 86 in the color filter array. This example is merely illustrative. If desired, the diffractive lenses may be formed under color filter elements 86 such that the diffractive lenses are interposed between the color filter elements 86 and photosensitive regions 82. Light can enter from the back side of the image pixels through diffractive lenses 62. While in FIG. 6 image sensor 16 is a back-side illuminated image sensor, image sensor 16 may instead be a front-side illuminated image sensor if desired. Photodiodes PD1 and PD2 may serve to absorb incident light focused by diffractive lenses 62 and produce pixel signals that correspond to the amount of incident light absorbed.

Color filters 86 may include green filters, red filters, blue filters, yellow filters, cyan filters, magenta filters, clear filters, infrared filters, or other types of filters. As an example, a green filter passes green light (e.g., light with wavelengths from 495 nm to 570 nm) and reflects and/or absorbs light out of that range (e.g., the green filter reflects red light and blue light). An example of a color filter array pattern that may be used is the GRBG (green-red-blue-green) Bayer pattern. In this type of configuration, the color filter array is arranged into groups of four color filters. In each group, two of the four color filters are green filters, one of the four color filters is a red filter, and the remaining color filter is a blue filter. If desired, other color filter array patterns may be used.

A layer 94 (sometimes referred to as a planarization layer, passivation layer, dielectric layer, film, planar film, or planarization film) may be formed over diffractive lenses 62. Planarization layer 94 may be formed across the entire array of imaging pixels in image sensor 16. Layer 94 may have any desired index of refraction (e.g., greater than, less than, or equal to the index of refraction of portions 64 of diffractive lenses 62). A second layer 92 may be formed between diffractive lenses 62 (e.g., layer 92 may be interposed between the side surfaces of adjacent diffractive lenses 62). Layer 92 may have an index of refraction that is less than the index of refraction of portions 64 of diffractive lenses 62 when diffractive lenses are used to focus light. Alternatively, however, layer 92 may have an index of refraction that is greater than the index of refraction of portions 64 of the diffractive lenses if the diffractive lenses were used to defocus light. A third layer 90 may be formed under diffractive lenses 62 between diffractive lenses 62 and color filters 86. Layer 90 may have any desired index of refraction (e.g., greater than, less than, or equal to the index of refraction of portions 64 of diffractive lenses 62). Layers 90, 92, and 94 may be transparent and may be formed from any desired materials. Layers 90, 92, and 94 may be formed from the same materials or different materials. In one possible example, layers 90, 92, and 94 may all be formed from the same material and the diffractive lenses may be embedded within the material. Layers 90, 92, and 94 may sometimes be referred to as planarization layers, dielectric layers, or cladding layers. In some cases, one or more of layers 90, 92, and 94 may be formed from air (i.e., an air gap may present be between diffractive lenses 62).

The difference in refractive index between each diffractive lens portion may be any desired refractive index difference (e.g., greater than 0.2, greater than 0.3, greater than 0.4, greater than 0.5, greater than 0.8, greater than 1.0, between 0.2 and 0.5, between 0.2 and 0.8, between 0.2 and 1.0, less than 1.0, less than 0.5, less than 0.3, etc.).

Each portion of diffractive lenses 62 may be formed from any desired material. It may be desirable for diffractive lenses 62 to be transparent and formed from a material with a higher refractive index than the surrounding materials (e.g., layer 92). Each portion of each diffractive lens may be formed from silicon nitride (with a refractive index of approximately 2.0), from silicon dioxide (with a refractive index of approximately 1.45), from silicon oxynitride (with a refractive index of approximately 1.8), or any other desired material. In general, each portion of each diffractive lens 62 may have any desired index of refraction (e.g., between 1.8 and 2.0, between 1.6 and 2.2, between 1.5 and 2.5, between 1.5 and 2.0, more than 1.3, more than 1.6, more than 1.8, more than 2.0, less than 2.0, less than 1.8, etc.). Layer 92 may also be transparent and formed from a material with any desired refractive index (e.g., a lower refractive index than portions 64 of diffractive lenses 62). Planar layer 92 may be formed from a material with a refractive index between 1.3 and 1.5, between 1.2 and 1.8, greater than 1.3, or any other desired refractive index.

The refractive indices of the portions of diffractive lenses 62 and the surrounding material (e.g., layer 92) may be selected such that light is focused by the diffractive lenses towards the photodiodes of the pixels. FIG. 6 shows incident light 46 being focused towards photosensitive area PD2 by diffractive lens 62, for example. Focusing incident light in this way may reduce optical cross-talk between pixels. The example of using focusing multipart diffractive lenses in image sensor 16 (as in FIG. 6) is merely illustrative. Any of the diffractive lenses shown herein (i.e., in FIGS. 3A, 3B, 4A, 4B, 5A-5E, 7A-7E, 8A, and 8B) may be incorporated into image sensor 16 in the same manner as shown in FIG. 6.

As previously discussed, the refractive indices of the diffractive lenses and surrounding materials, as well as the dimensions of the diffractive lenses, may be altered to customize the response to incident light. Additionally, the distance 102 between each diffractive lens may be altered to change the response of incident light.

In some embodiments, the diffractive lens over each pixel in the pixel array may be the same. However, in other embodiments different pixels may have unique diffractive lenses to further customize the response to incident light.

In the example of FIG. 6, at least one diffractive lens is formed over each pixel. These diffractive lenses may take the place of other per-pixel lenses (i.e., the diffractive lenses may be the only per-pixel lenses over the pixels in the pixel array). For example, no microlenses may be present over each pixel that have curved upper surfaces. No microlenses may be present over each pixel that use refraction to focus light. Microlenses with curved upper surfaces that use refraction to focus light may optionally be included over each diffractive lens if desired.

In the example of FIG. 6, one multipart diffractive lens is formed over each pixel. This example is merely illustrative. If desired, more than one diffractive lens may be formed over each image pixel. For example, one or more focusing diffractive lens and one or more defocusing diffractive lens may be formed over each pixel. Each diffractive lens may be either a multipart diffractive lens (as in FIG. 5A or 5B, for example) or may be a single-part diffractive lens (as in FIG. 3A or 3B, for example). All of the diffractive lenses over a pixel may be focusing diffractive lenses, all of the diffractive lenses over a pixel may be defocusing diffractive lenses, or there may be both focusing and defocusing diffractive lenses over a pixel. Similarly, all of the diffractive lenses over a pixel may be multipart diffractive lenses, all of the diffractive lenses over a pixel may be single-part diffractive lenses, or multipart and single-part diffractive lenses may both be formed over a pixel.

Figure 7A:
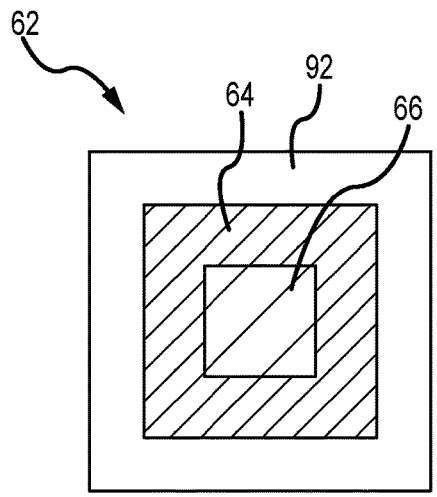
FIGS. 7A-7E are top views of illustrative multipart diffractive lenses showing different shapes for the multipart diffractive lenses in accordance with an embodiment.
Figure 7B:
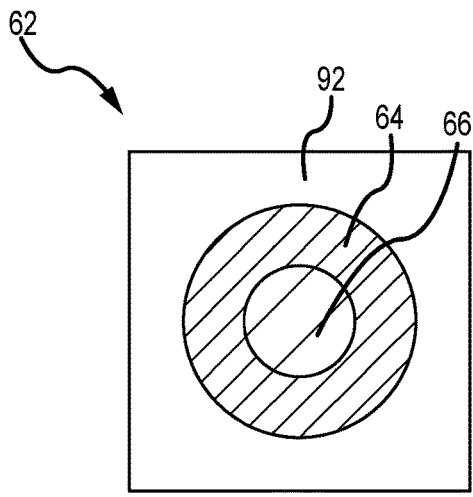
Figure 7C:
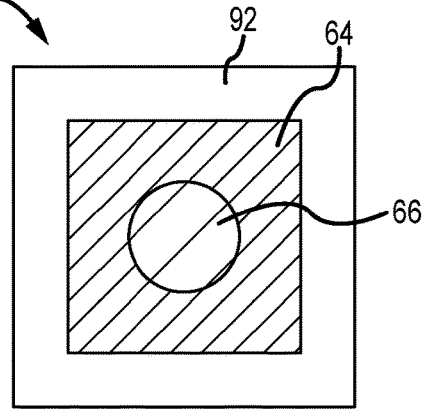
Figure 7D:
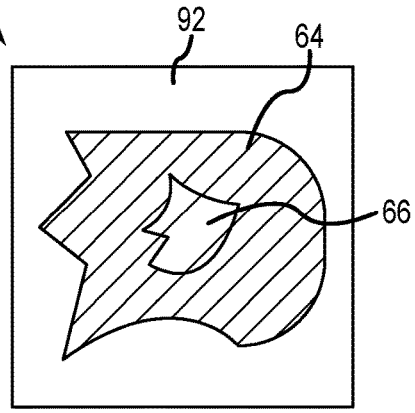
Figure 7E:
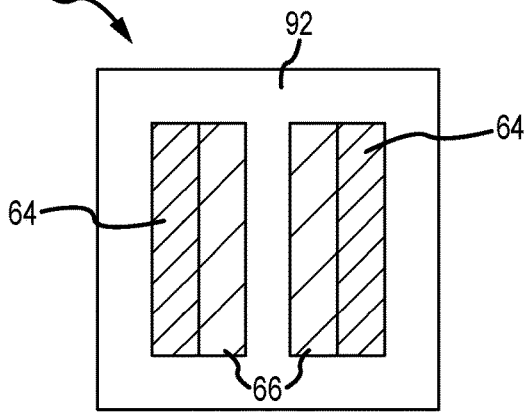

Each diffractive lens 62 may have any desired shape. FIGS. 7A-7E are top views of illustrative diffractive lenses with different shapes. As shown in FIG. 7A, diffractive lens 62 may have a portion 66 with a rectangular (or square) shape and a portion 64 that laterally surrounds portion 66 and has a rectangular (or square) outer perimeter. As shown in FIG. 7B, portion 66 of diffractive lens 62 may be formed from a shape with curved edges such as a circle or oval and portion 64 of diffractive lens 62 may laterally surround portion 66 and have an outer perimeter that is a circle or oval. In the embodiments of FIGS. 7A and 7B, portions 64 and 66 have the same shape. This example is merely illustrative. As shown in FIG. 7C, diffractive lens 62 may have a portion 66 (sometimes referred to as inner portion 66) with a different shape than portion 64 (sometimes referred to as outer portion 64). As shown in FIG. 7D, the diffractive lens does not have to be a regular shape. FIG. 7D shows an irregularly shaped diffractive lens. Each portion of the diffractive lens may include one or more planar sides, one or more curved sides that curve outward, and/or one or more curved sides that curve inward. Finally, as shown in FIG. 7E, the diffractive lens may be split into more than one section. Portion 64 of diffractive lens 62 may have two or more separately formed vertical sections or two or more separately formed horizontal sections. Similarly, as shown in FIG. 7E, portion 66 of diffractive lens 62 may have two or more separately formed vertical sections or two or more separately formed horizontal sections.

In the example of FIG. 6, portions 64 and 66 of diffractive lens 62 have a uniform height (thickness). This example is merely illustrative. In general, in a multipart diffractive lens (with multiple portions having different refractive indices) each portion of the diffractive lens may have any desired width, height, and thickness. The width, height, and thickness, of each portion can optionally match the respective width, height, and/or thickness of one or more other portions of the diffractive lens if desired.

Figure 8A:
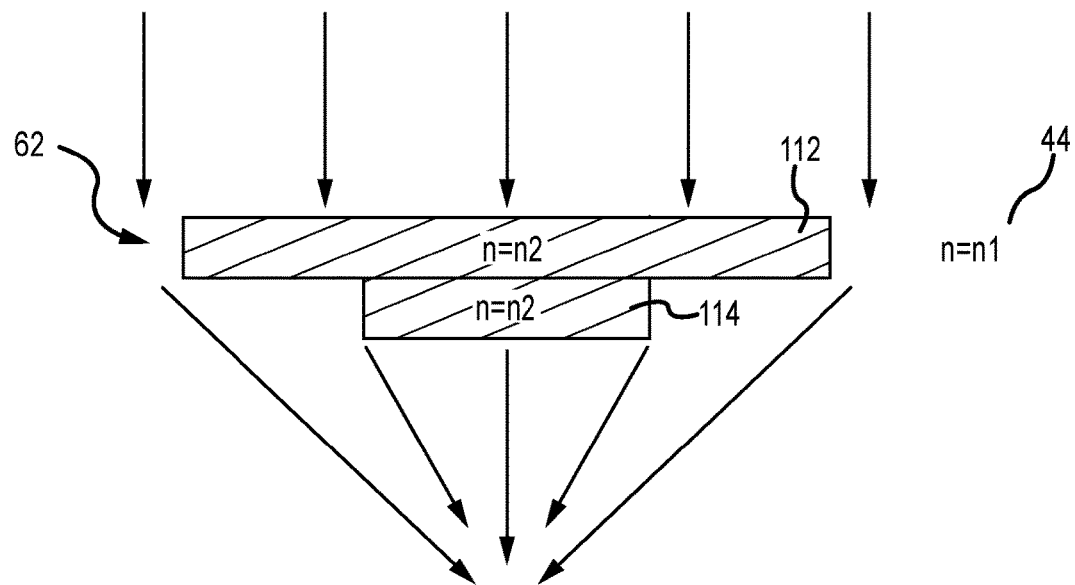
FIG. 8A is a cross-sectional side view of an illustrative multipart focusing diffractive lens with two stacked layers having greater indices of refraction than the surrounding medium in accordance with an embodiment.
Figure 8B:
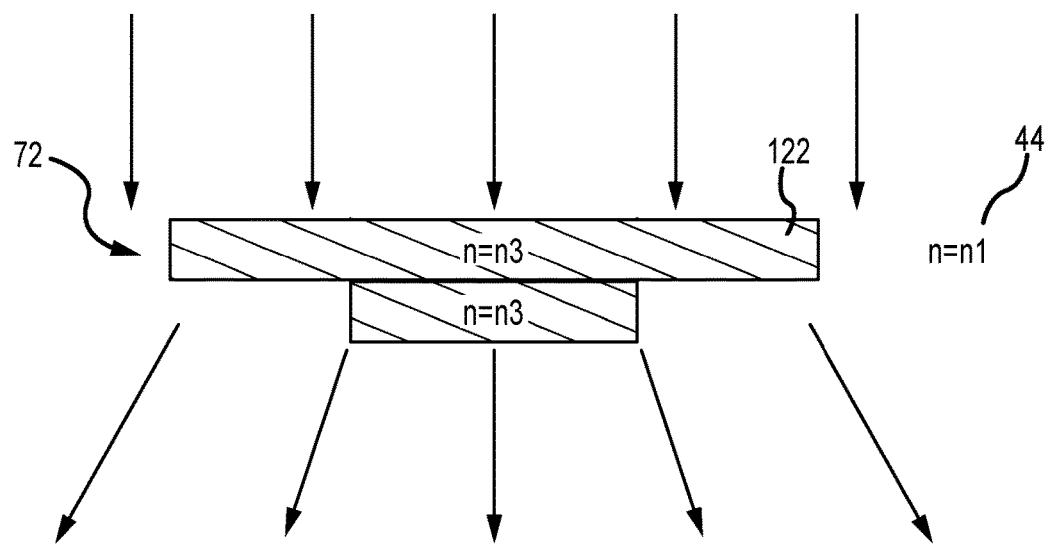
FIG. 8B is a cross-sectional side view of an illustrative multipart defocusing diffractive lens with two stacked layers having lower indices of refraction than the surrounding medium in accordance with an embodiment.

FIGS. 5A, 5B, 6, and 7 depict multipart diffractive lenses that have different portions having different refractive indices within a single layer. This example is merely illustrative. In an alternate embodiment, a multipart diffractive lens may be formed by two stacked layers having the same refractive index and different widths. FIGS. 8A and 8B show examples of this type. In FIG. 8A, a focusing multipart diffractive lens 62 is shown that includes a first layer of material 112 that is formed over and overlaps a second layer of material 114. The first and second diffractive lens layers 112 and 114 may both have the same refractive index (n2) that is greater than the refractive index (n1) of the surrounding material 44. The underlying layer (114) may have a smaller width than layer 112. With this arrangement, light that passes through the diffractive lens at a point between the center of the edge of the lens may be focused.

In FIG. 8B, a defocusing multipart diffractive lens 72 is shown that includes a first layer of material 122 that is formed over and overlaps a second layer of material 124. The first and second diffractive lens layers 122 and 124 may both have the same refractive index (n3) that is less than the refractive index (n1) of the surrounding material 44. The underlying layer (124) may have a smaller width than layer 122. With this arrangement, light that passes through the diffractive lens at a point between the center of the edge of the lens may be defocused.

FIGS. 8A and 8B depict stacked layers having the same refractive index as being used to form the multipart diffractive lens. This example is merely illustrative. If desired, the stacked layers may have different refractive indices. Three, four, five, or more than five stacked layers each having any desired refractive index may be used to form the multipart diffractive lens.

Figure 9A:
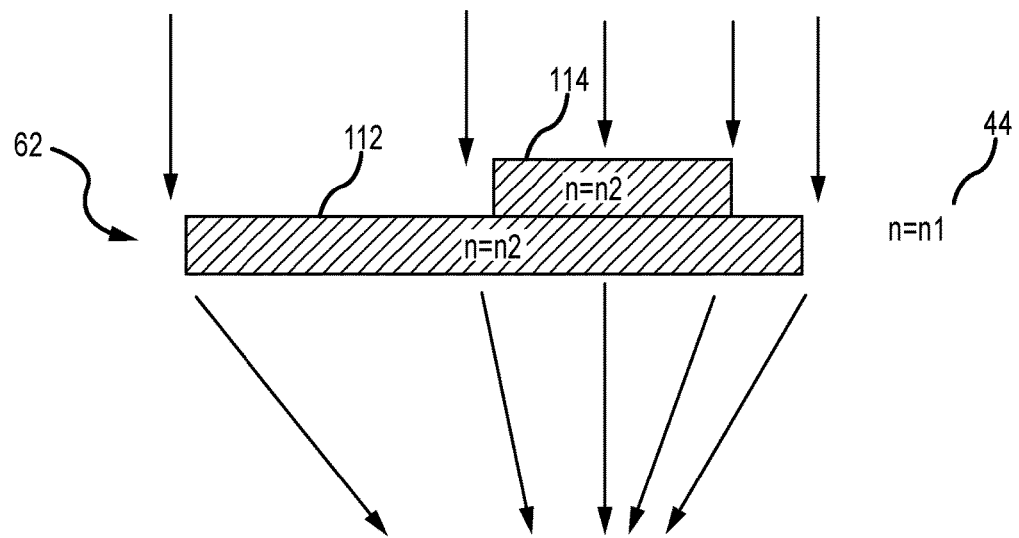
FIG. 9A is a cross-sectional side view of an illustrative asymmetric multipart focusing diffractive lens with two stacked layers having greater indices of refraction than the surrounding medium in accordance with an embodiment.
Figure 9B:
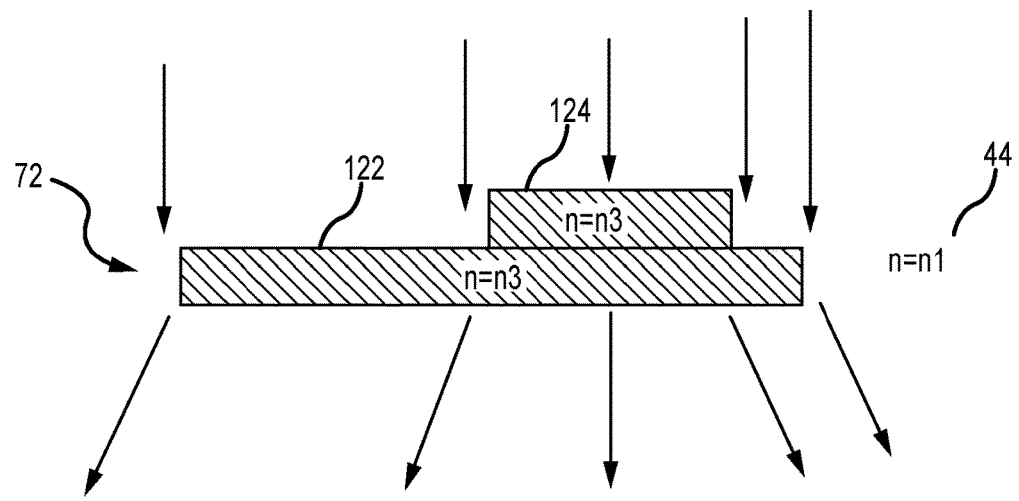
FIG. 9B is a cross-sectional side view of an illustrative asymmetric multipart defocusing diffractive lens with two stacked layers having lower indices of refraction than the surrounding medium in accordance with an embodiment.

The stacked diffractive lenses of FIGS. 8A and 8B are symmetric. These examples are merely illustrative. As discussed in connection with FIGS. 5D and 5E, the diffractive lenses may be asymmetric. FIGS. 9A and 9B are cross-sectional side views of stacked asymmetric diffractive lenses. In FIG. 9A, a focusing multipart asymmetric diffractive lens 62 is shown that includes a first layer of material 112 and a second layer of material 114 that are overlapping. The first and second diffractive lens layers 112 and 114 may both have the same refractive index (n2) that is greater than the refractive index (n1) of the surrounding material 44. Layer 114 may have a smaller width than layer 112. Layer 114 may be shifted off-center from layer 112, as shown in FIG. 9A.

In FIG. 9B, a defocusing asymmetric multipart diffractive lens 72 is shown that includes a first layer of material 122 and a second layer of material 124 that are overlapping. The first and second diffractive lens layers 122 and 124 may both have the same refractive index (n3) that is less than the refractive index (n1) of the surrounding material 44. Layer (124) may have a smaller width than layer 122. Layer 124 may be shifted off-center from layer 122, as shown in FIG. 9A.

FIGS. 9A and 9B depict asymmetric stacked layers having the same refractive index as being used to form the multipart diffractive lens. This example is merely illustrative. If desired, the asymmetric stacked layers may have different refractive indices. Three, four, five, or more than five stacked layers each having any desired refractive index may be used to form the multipart asymmetric diffractive lens.

In FIGS. 8A and 8B, the smaller layer (i.e., the layer with the smaller width) in the stacked diffractive lens is below the larger layer. In FIGS. 9A and 9B, the smaller layer in the stacked diffractive lens is above the larger layer. In general, any number of layers with any desired widths may be stacked in any desired order to control the direction of incident light.

In various embodiments, an image sensor may include a plurality of imaging pixels and each imaging pixel may include a photodiode and a diffractive lens formed over the photodiode. The diffractive lens may have a first portion with a first refractive index and a second portion with a second refractive index that is different than the first refractive index.

The first portion may be an edge portion and the second portion may be a center portion and the first refractive index may be less than the second refractive index. The edge portion may laterally surround the center portion. The edge portion may be adjacent a material with a third refractive index that is different than the first and second refractive indices. The third refractive index may be less than the first refractive index.

Each diffractive lens may also include a third portion with a third refractive index that is different than the first and second refractive indices. The second portion may be interposed between the first portion and the third portion and the second refractive index may be less than the first refractive index and greater than the first refractive index. The diffractive lens of each imaging pixel may have a planar upper surface and a planar lower surface. No microlens with a curved surface may be formed over the diffractive lens of each pixel. Each imaging pixel of the plurality of imaging pixels may also include a color filter element interposed between the photodiode and the diffractive lens of that imaging pixel.

In various embodiments, an image sensor may include a plurality of imaging pixels and each imaging pixel of the plurality of imaging pixels may include a photosensitive area, a color filter element formed over the photosensitive area, and a multipart diffractive lens formed over the color filter element that focuses incident light on the photosensitive area.

The multipart diffractive lens may include first and second portions having respective first and second refractive indices. The second portion may laterally surround the first portion. The second refractive index may be less than the first refractive index. The multipart diffractive lens may be surrounded by a material having a third refractive index that is less than the second refractive index. The multipart diffractive lens may include a first layer and a second layer formed over the first layer, the first layer may have a first width and the second layer may have a second width that is greater than the first width. The first and second layers may have the same refractive index and may be surrounded by a material with an additional refractive index that is less than the refractive index of the first and second layers. No microlens with a curved surface may be formed over the multipart diffractive lens of each pixel.

In various embodiments, an image sensor may include a plurality of imaging pixels and each imaging pixel of the plurality of imaging pixels may include a photodiode and a diffractive lens formed over the photodiode. The diffractive lens may have a plurality of portions with respective refractive indices that increase as a distance of the respective portion from an edge of the diffractive lens increases. The plurality of portions may be concentric.

The foregoing is merely illustrative of the principles of this invention and various modifications can be made by those skilled in the art without departing from the scope and spirit of the invention.

What is claimed is:

1. An image sensor comprising a plurality of imaging pixels, wherein each imaging pixel of the plurality of imaging pixels comprises:
   a photodiode; and
   a diffractive lens formed over the photodiode,
   wherein the diffractive lens has an edge portion with a first refractive index and a center portion with a second refractive index that is different than the first refractive index and wherein the edge portion is adjacent a solid material with a third refractive index that is different than the first and second refractive indices.

2. The image sensor defined in claim 1, wherein the edge portion laterally surrounds the center portion.

3. The image sensor defined in claim 1, wherein the third refractive index is less than the first refractive index and wherein the second refractive index is greater than the first refractive index.

4. The image sensor defined in claim 1, wherein each diffractive lens further comprises a third portion with a fourth refractive index that is different than the first, second, and third refractive indices.

5. An image sensor comprising a plurality of imaging pixels, wherein each imaging pixel of the plurality of imaging pixels comprises:

a photodiode; and a diffractive lens formed over the photodiode, wherein the diffractive lens has a first portion with a first refractive index, a second portion with a second refractive index, and a third portion with a third refractive index, wherein the second portion is interposed between the first portion and the third portion and wherein the second refractive index is less than the first refractive index and greater than the first refractive index.

6. The image sensor defined in claim 1, wherein the diffractive lens of each imaging pixel has a planar upper surface and a planar lower surface.

7. The image sensor defined in claim 1, wherein no microlens with a curved surface is formed over the diffractive lens of each pixel.

8. The image sensor defined in claim 1, wherein each imaging pixel of the plurality of imaging pixels further comprises a color filter element interposed between the photodiode and the diffractive lens of that imaging pixel.

9. An image sensor comprising a plurality of imaging pixels, wherein each imaging pixel of the plurality of imaging pixels comprises:

a photosensitive area;

a color filter element formed over the photosensitive area; and a multipart diffractive lens formed over the color filter element that focuses incident light on the photosensitive area, wherein the multipart diffractive lens comprises a first layer and a second layer formed over the first layer, wherein the first layer has a first width, wherein the second layer has a second width that is greater than the first width, and wherein the first and second layers have the same refractive index.

10. The image sensor defined in claim 9, wherein the first and second layers are surrounded by a material with an additional refractive index that is less than the refractive index of the first and second layers.

11. The image sensor defined in claim 9, wherein no microlens with a curved surface is formed over the multipart diffractive lens of each pixel.

12. The image sensor defined in claim 9, wherein the first layer has a first uniform thickness and wherein the second layer has a second uniform thickness.

13. The image sensor defined in claim 4, wherein the third portion is interposed between the center portion and the edge portion.

* * * * *